United States Patent
Zhang et al.

(10) Patent No.: US 11,220,919 B2
(45) Date of Patent: Jan. 11, 2022

(54) METHOD OF MAKING A SINGLE-CRYSTAL TURBINE BLADE

(71) Applicant: PRATT & WHITNEY CANADA CORP., Longueuil (CA)

(72) Inventors: Chao Zhang, Vaughan (CA); Robert Huszar, Saint-Bruno-de-Montarville (CA); Othmane Leghzaouni, Brossard (CA)

(73) Assignee: PRATT & WHTNEY CANADA CORP., Longueuil (CA)

( * ) Notice: Subject to any disclaimer, the term of this patent is extended or adjusted under 35 U.S.C. 154(b) by 165 days.

(21) Appl. No.: 16/515,383

(22) Filed: Jul. 18, 2019

(65) Prior Publication Data

US 2021/0017865 A1 Jan. 21, 2021

(51) Int. Cl.
| | |
|---|---|
| F01D 5/14 | (2006.01) |
| F01D 5/28 | (2006.01) |
| C30B 29/52 | (2006.01) |
| C30B 11/02 | (2006.01) |

(52) U.S. Cl.
CPC ............... *F01D 5/28* (2013.01); *C30B 11/02* (2013.01); *C30B 29/52* (2013.01); *F01D 5/147* (2013.01); *F05D 2230/50* (2013.01); *F05D 2250/232* (2013.01); *F05D 2300/607* (2013.01)

(58) Field of Classification Search
CPC . F01D 5/28; F01D 5/147; C30B 11/02; C30B 29/52; F05D 2230/50; F05D 2250/232; F05D 2300/607
See application file for complete search history.

(56) References Cited

U.S. PATENT DOCUMENTS

| | | | |
|---|---|---|---|
| 4,605,452 A | 8/1986 | Gemma et al. | |
| 5,061,154 A | 10/1991 | Kington | |
| 5,292,385 A | 3/1994 | Kington | |
| 5,340,278 A * | 8/1994 | Magowan | F01D 5/187 416/96 R |
| 5,843,586 A * | 12/1998 | Schaeffer | C30B 29/52 428/633 |
| 6,474,946 B2 | 11/2002 | Kildea | |
| 6,969,240 B2 * | 11/2005 | Strangman | F01D 5/3061 416/234 |
| 7,946,177 B2 * | 5/2011 | Kington | G01H 5/00 73/597 |
| 8,016,549 B2 | 9/2011 | Shah et al. | |
| 9,951,632 B2 * | 4/2018 | Waldman | F01D 11/006 |

FOREIGN PATENT DOCUMENTS

EP 0082100 B1 7/1988

* cited by examiner

*Primary Examiner* — Ninh H. Nguyen
(74) *Attorney, Agent, or Firm* — Norton Rose Fulbright Canada LLP

(57) ABSTRACT

A single-crystal turbine blade and a method of making such single-crystal turbine blade are disclosed. During manufacturing, a secondary crystallographic orientation of the material of the single-crystal turbine blade is controlled based on a parameter of a root fillet between an airfoil of the single-crystal turbine blade and a platform of the single-crystal turbine blade. The parameter can be a location of peak stress in the root fillet expected during use of the turbine blade.

18 Claims, 9 Drawing Sheets

METHOD OF MAKING A SINGLE-CRYSTAL TURBINE BLADE

TECHNICAL FIELD

The disclosure relates generally to gas turbine engines, and more particularly to manufacturing turbine blades.

BACKGROUND

Turbine blades for gas turbine engines may be manufactured using nickel-based superalloys or other metal systems. Mounted on turbine discs, these blades may spin at high speeds in gas streams of 1500° C. or higher. The design of turbine blades involves selecting an aerodynamically effective shape to achieve gas turbine performance objectives. The design also involves selecting turbine blade material to ensure turbine blades can have the requisite strength and durability. During gas turbine operation, some regions of the turbine blade can experience high steady-state stress and vibratory stress corresponding to low order dynamic modes for example. Existing methods of designing and manufacturing turbine blades may lead to increasing weight and/or compromising aerodynamic performance in order to meet strength and durability requirements.

SUMMARY

In one aspect, the disclosure describes a method of making a single-crystal turbine blade with a material having a face centered cubic crystallographic structure. The method comprises: during manufacturing of the single-crystal turbine blade, controlling a secondary crystallographic orientation of the material based on a parameter of a root fillet between an airfoil of the single-crystal turbine blade and a platform of the single-crystal turbine blade.

In another aspect, the disclosure describes a turbine blade comprising:
- an airfoil made of a material having a single-crystal face centered cubic crystallographic structure;
- a platform connected to the airfoil; and
- a root fillet defined between the airfoil and the platform;
- wherein a secondary crystallographic orientation of the material is based on a parameter of the root fillet.

In a further aspect, the disclosure describes a method of making a turbine blade including an airfoil made of a material having a single-crystal crystallographic structure, a platform connected to the airfoil and a root fillet defined between the airfoil and the platform. The method comprises:
- determining a location of peak stress in the root fillet expected during use of the turbine blade; and
- during manufacturing of the turbine blade, controlling a secondary crystallographic orientation of the material based on the location of peak stress in the root fillet.

Further details of these and other aspects of the subject matter of this application will be apparent from the detailed description included below and the drawings.

DESCRIPTION OF THE DRAWINGS

Reference is now made to the accompanying drawings, in which.

DETAILED DESCRIPTION

The following disclosure relates to single-crystal turbine blades and methods of manufacturing thereof. In some embodiments, the methods disclosed herein can help reduce one or more peak stress values particularly in the root fillet region, i.e. the fillet formed between the turbine blade airfoil and platform, compared to existing single-crystal turbine blades.

The concepts disclosed herein are broadly applicable to turbine blades constructed of any suitable materials, however, these concepts are particularly useful when applied to metallic materials intended for use at elevated temperatures. Typical of such metals are the nickel and cobalt based superalloys which possess relatively high strength and oxidation and corrosion resistance under demanding conditions encountered in gas turbine engines.

In the discussion which follows, reference is made to single crystals. This term is intended to mean crystalline materials free from high angle grain boundaries. The term "single crystal" is intended to encompass materials which contain non-mobile low angle grain boundaries and dislocation arrays. Also covered by this term, as used herein, are materials having a regular crystalline matrix which contains a dispersed second phase which may be coherent or non-coherent with the matrix phase. Examples of such materials are nickel based superalloys which contain a coherent dispersion of gamma prime particles in a gamma matrix, and eutectic materials.

Aspects of various embodiments are described in relation to the figures.

Figure 1:
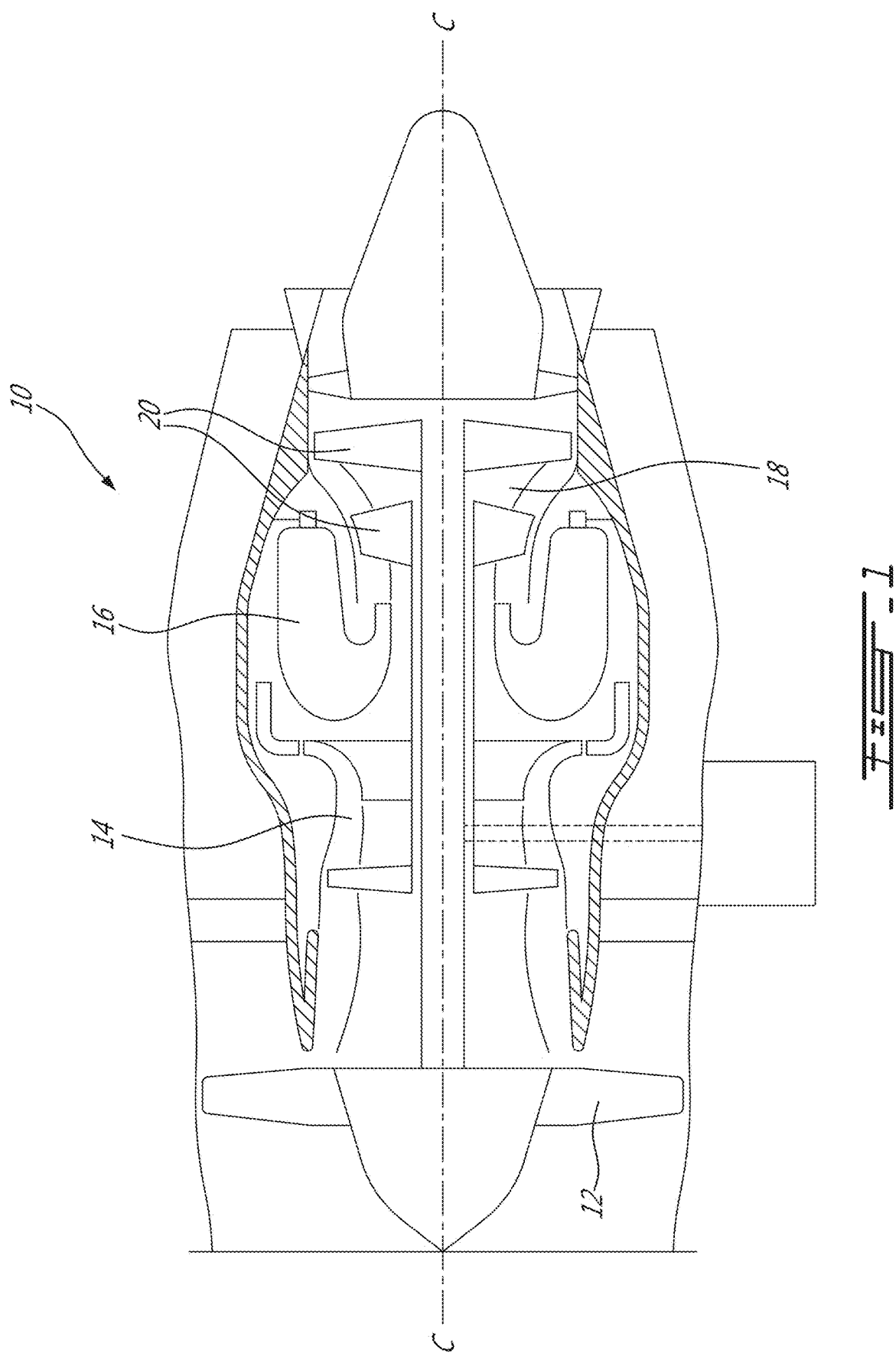
FIG. 1 is a schematic cross-sectional view of a turbofan gas turbine engine having one or more turbine blades as described herein.

FIG. 1 illustrates a gas turbine engine 10 of a type preferably provided for use in subsonic flight, generally comprising in serial flow communication a fan 12 through which ambient air is propelled, a multistage compressor 14 for pressurizing the air, a combustor 16 in which the compressed air is mixed with fuel and ignited for generating an annular stream of hot combustion gases, and a turbine section 18 for extracting energy from the combustion gases. The turbine section may comprise one or more turbine(s) 20 arranged along a central axis c-c of the gas turbine engine 10. In some embodiments, engine 10 may be a turbo-fan engine. However, it is understood that aspects of the present disclosure are applicable to other types of engines such as turbo-prop and turbo-shaft for example. A turbine 20 may comprise turbine disc 35 (shown in FIG. 2) having attached thereto a plurality of turbine blades 29 (shown in FIG. 2).

Figure 2:
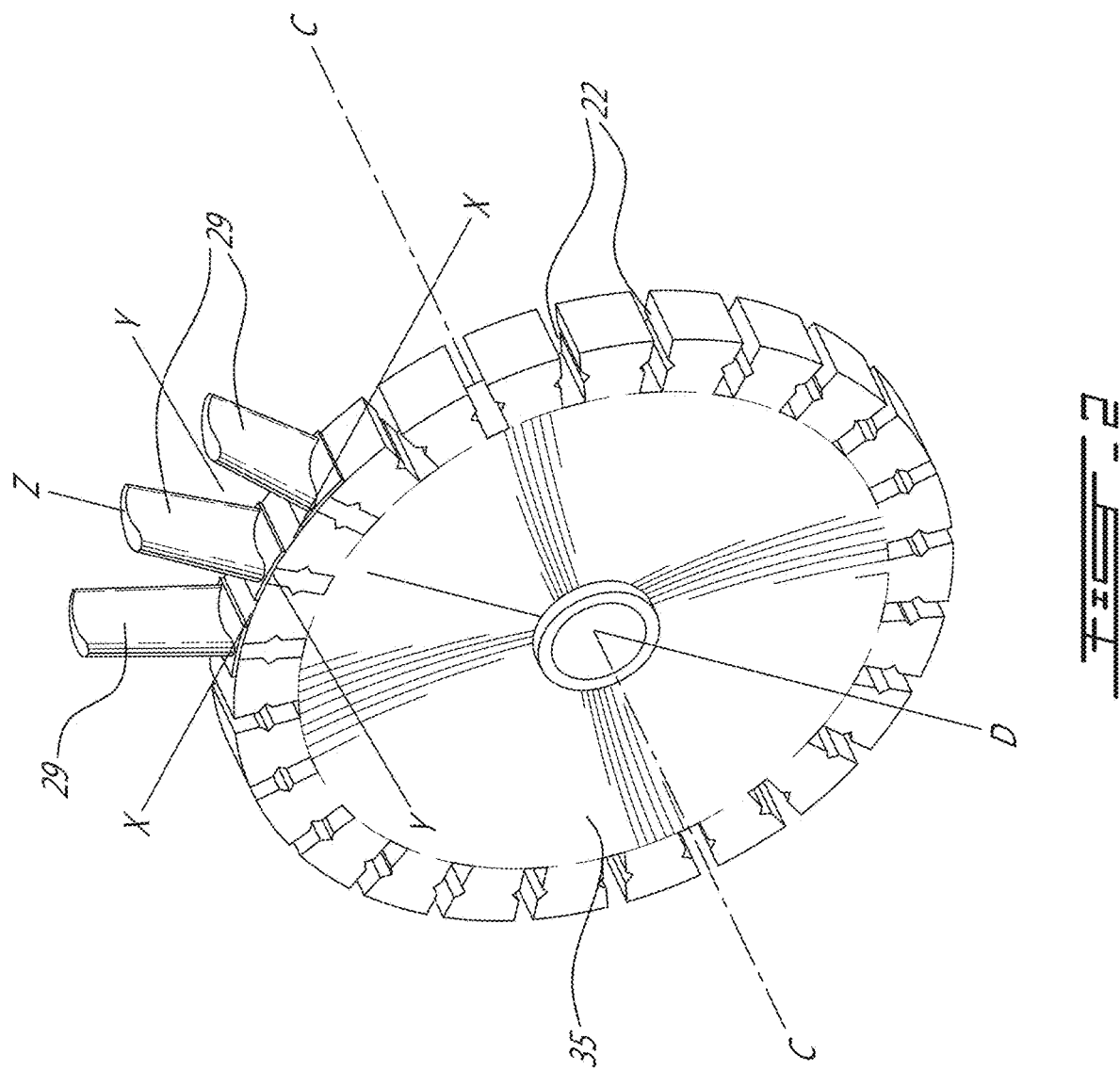
FIG. 2 shows an embodiment of a turbine disc of a gas turbine engine with mountable turbine blades.

FIG. 2 shows an embodiment of a turbine disc 35 of a gas turbine engine with mountable turbine blades 29. The turbine blades 29 may be configured to be removably attached to the turbine disc 35. The turbine disc 35 may comprise a central axis c-c aligned (e.g., coaxial) with the central axis of the gas turbine engine 10.

Figure 3:
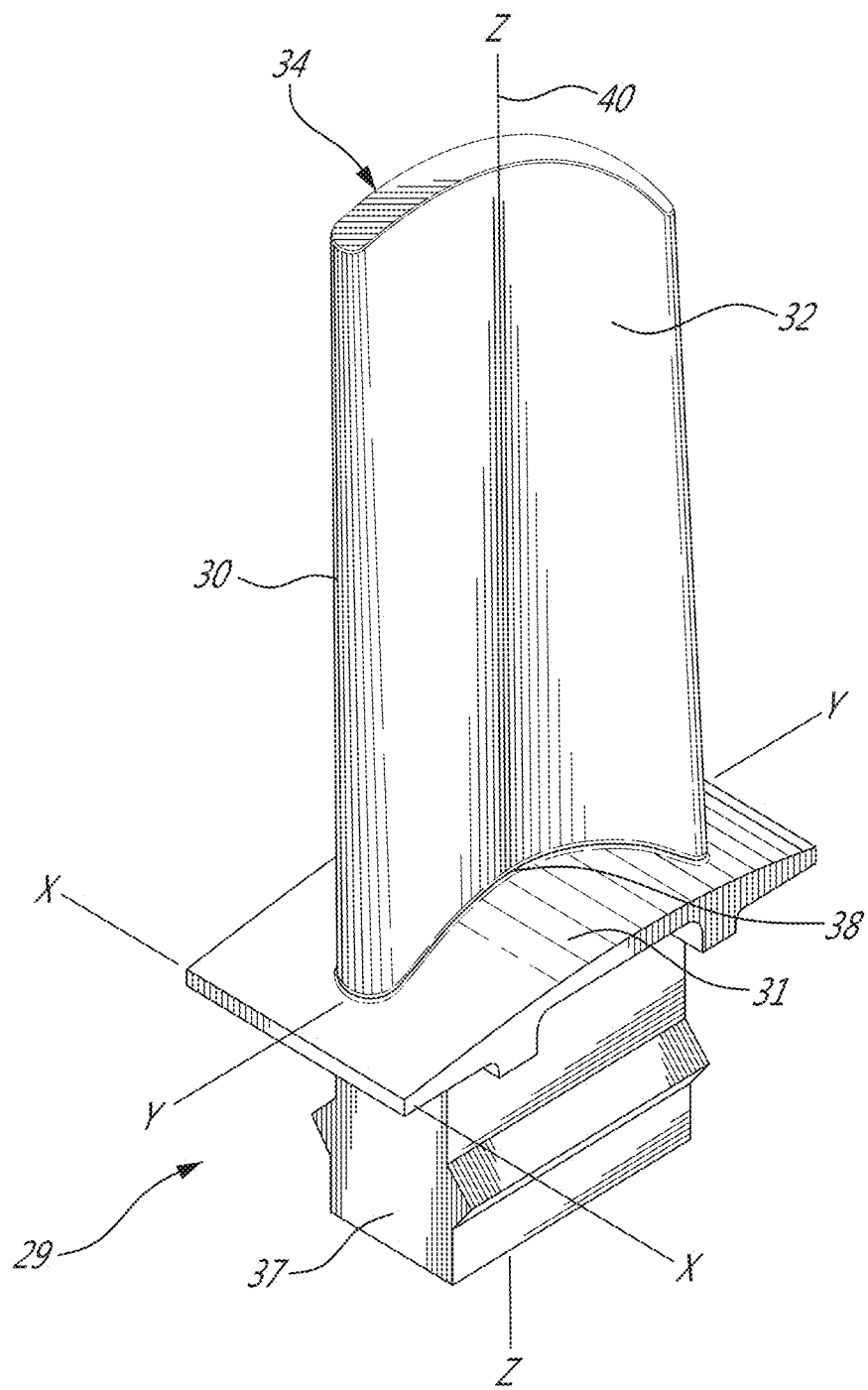
FIG. 3 shows an embodiment of a turbine blade suited for mounting in a turbine disc of a gas turbine engine.

FIG. 3 shows an embodiment of the turbine blade 29 suitable for mounting to the turbine disc 35 of a gas turbine engine 10 and may comprise a blade airfoil 30 and a blade platform 31. In some embodiments, a root portion 37 of the blade platform 31 may be configured to be received into a complementary slot 22 (shown in FIG. 2) formed in the turbine disc 35. In some embodiments, the root portion 37 and the slot 22 in the turbine disc 35 may form a dovetail joint. In some embodiments, the turbine disc 35 and blades 29 may be part of an integral whole (e.g., have a unitary construction, be integrally formed). In such an embodiment, a portion of the turbine disc 35 may define the blade platform 31.

Hot combustion gases exiting the combustor 16 of the gas turbine engine 10 may enter the turbine section 18 of the gas turbine engine 10 and, after possibly flowing through one or more stator sections, may impinge on the blade airfoils 30 to generate forces on the turbine blades 29. The turbine disc 35 may define a coordinate system wherein a first axis (y) is parallel to the centerline c-c of the engine 10 about which the disc 35 rotates, a second axis (z) coincides with a radial direction of the engine 10, and a third axis (x) is mutually perpendicular to the z and y axes. The airfoil stacking line 40 is a reference line commonly used to designate the position in space of planar cross sections of the turbine blade 29 and may lie along the aforementioned z axis. The airfoil stacking line 40 may extend radially from centerline c-c.

The platform 31 may be connected to a root portion 37 for mounting to the disk 35 to transfer torque to the turbine disc 35, about the central axis c-c of the turbine disc 35, upon receiving a gas impingement. The airfoil 30 may have a non-convex (e.g., concave) side, also called the pressure side 32, and a convex side, also called the suction side 34. The platform 31 may be disposed and connected to the base of the airfoil 30. The platform 31 may extend generally transversely to the bottom of the airfoil 30.

In use, the turbine blade 29 may become heated as the airfoil 30 is subjected to impingement of hot combustion gases while mounted to the turbine disc 35, spinning at high speeds in a gas stream of 1500° C. or higher. In addition, there may be varying mechanical loads, both steady and vibratory, due to the spinning of the disc-mounted blade 29 about the central axis c-c of the engine 10. The combined mechanical and thermal loadings are such that the turbine blade 29 may be prone to high stresses in certain regions of the blade 39. One such region is the root fillet 38 formed at the intersection of the blade airfoil 30 and the blade platform 31. During engine operation, the root fillet 38 may be especially prone to experience high steady-state stress and also high vibratory stress corresponding to varying dynamic modes of the gas turbine engine 10 for example.

Figure 4:
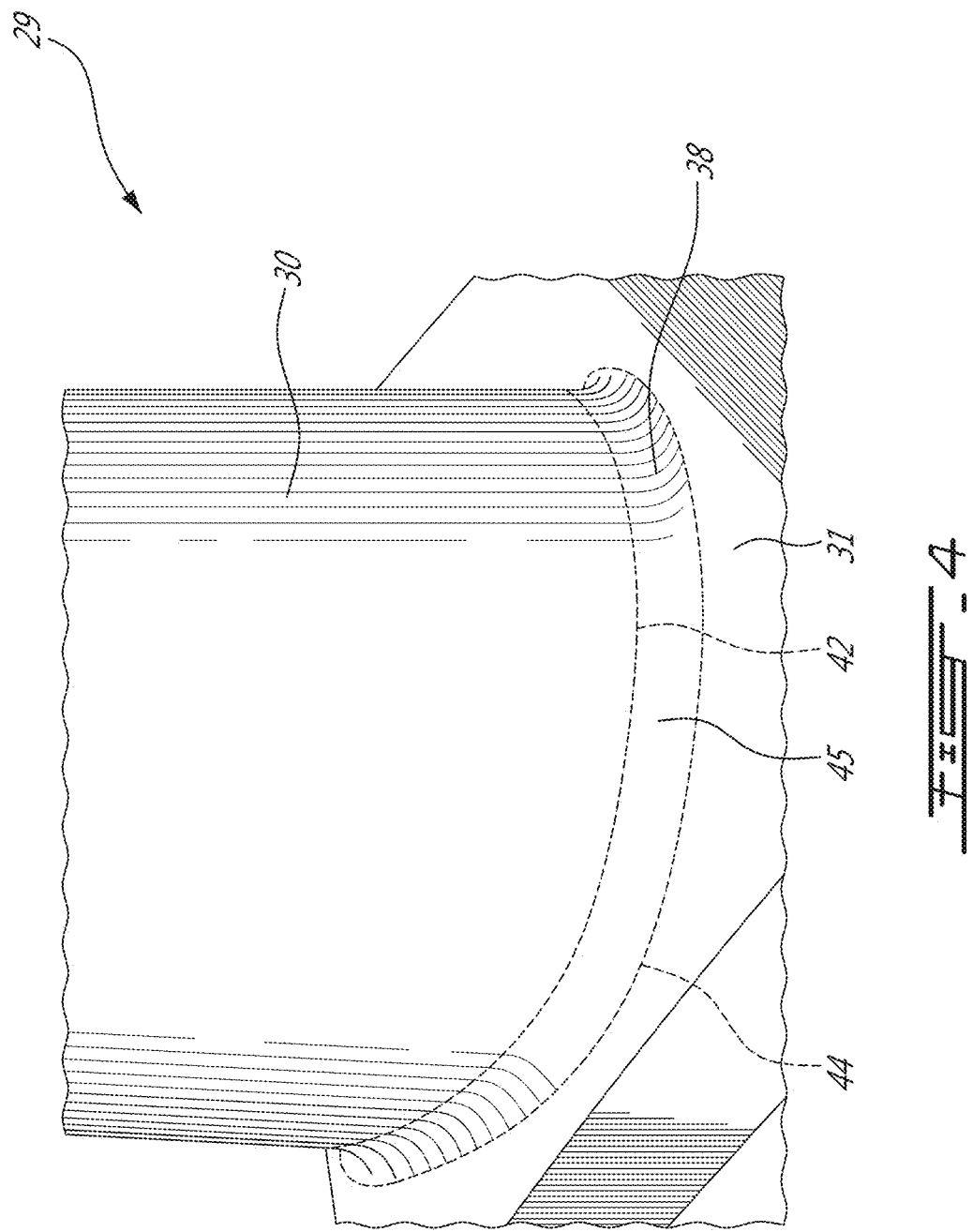
FIG. 4 shows a root fillet formed between an airfoil and a platform of a turbine blade.

FIG. 4 shows a root fillet 38 of an embodiment of the turbine blade 29. The root fillet 38 may comprise an edge 44 proximal to the blade platform 31 and an edge 42 proximal to the blade airfoil 30. The edges 42, 44 may be fillet runout curves. The curved surface 45 between the two edges 42, 44 may experience relatively high amplitude (e.g., slowly evolving) stresses.

Turbine blades 29, or part(s) thereof (e.g., airfoil 30 and/or root fillet 38) may be manufactured from a material with a crystal structure designed to withstand the high mechanical and thermal loads, e.g. nickel based superalloys. It may be advantageous to control the orientation of the crystal structure of the material of the blade 29 to obtain desired properties, and particularly lower stresses in the root fillet 38.

Figure 5:
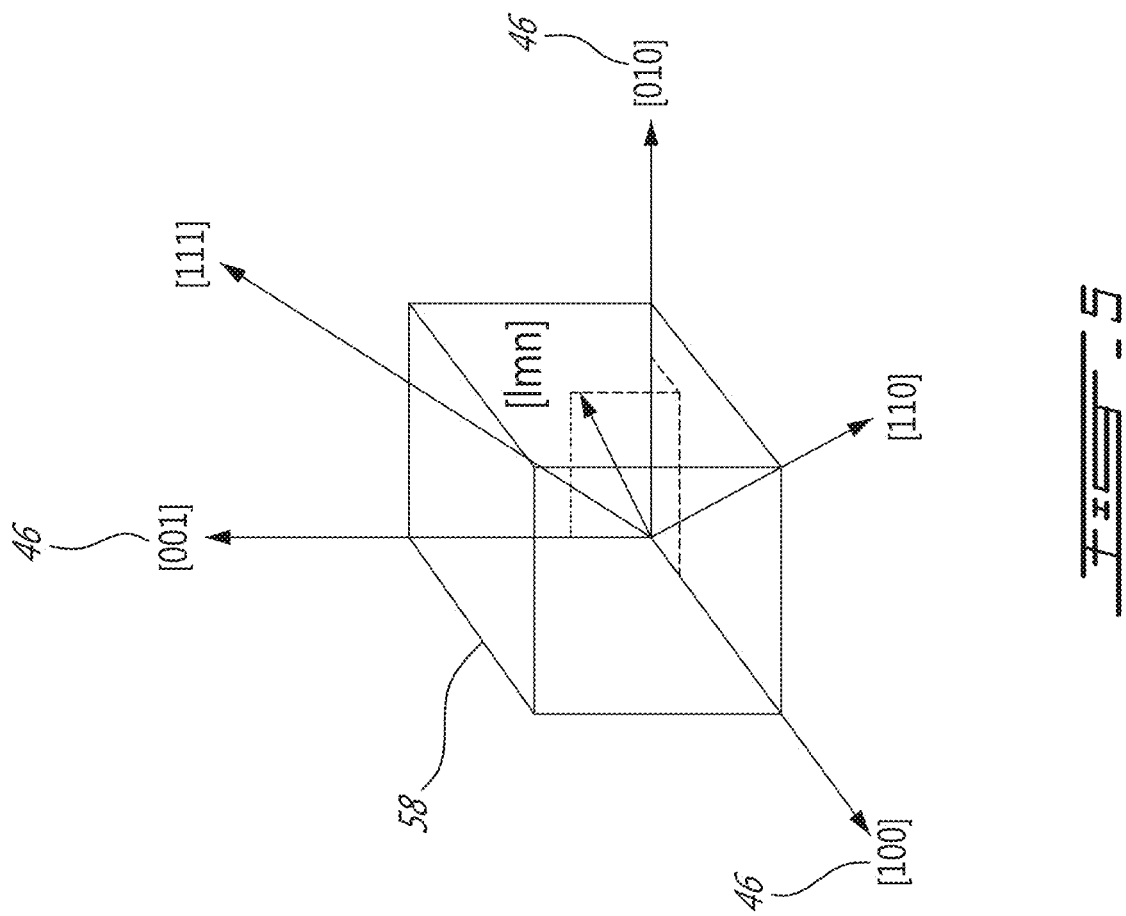
FIG. 5. shows conventional Miller indices for a cubic crystallographic system.

FIG. 5. shows the conventional Miller indices 46 for an octal unit cell 58 of a cubic crystallographic system such as body centred cubic (BCC) or a face centred cubic (FCC) crystal, characteristic of some metals or metal systems such as superalloys comprising nickel, aluminum, copper, and/or chromium. A crystal of one of these materials may have an orientation which can be defined using such Miller indices 46. In the cubic system of FCC and BCC crystals, specification of the orientation in space of any two orthogonal axes may fully define the orientation of a crystal, e.g. fixing the [100] axis fixes the remaining crystal axes to an orthogonal pair lying in a plane perpendicular to the [100] axis, then further fixing the [001] axis fixes the orientation in this plane, thereby fully specifying the crystal orientation. Because of symmetry, various other directions in a crystal may be equivalent. Thus, our discussion herein regarding any particular indices [PGR] will be instructive for a full set of equivalent directions <PGR>.

Properties (e.g., mechanical properties, Young's modulus) of a crystalline material may vary with orientation of the crystalline structure and thus it may be advantageous to control crystal orientation during manufacturing of the turbine blade 29. Referring to FIG. 5, material properties along the [010] may be the same as the properties along the [001] axis. Lying in the plane of the [100] and [010] axes is the 110 axis at a 45° angle to the [100] axis. The properties of the crystal material along [110] may be vary from the properties along [100] and [010]. As a matter of convention, the axes [100], [110] and [010] are characterized as "secondary axes'", and their orientation with respect to the axes (x, y, and z) of a part (i.e., orientation of crystal axes within x-y planes transverse to the z axis) is called the "secondary crystallographic orientation" or simply "secondary orientation". However, it should be evident inasmuch as the axes are fixed by the crystal structure, reference to any other axis as secondary would be equally definitive.

Directional solidification is a method of casting involving the use of controlled cooling to cause a solidification interface to move progressively through a mold filled with molten metal. In some embodiments of this method, a low-temperature "chill plate" is placed at the bottom of a ceramic mold containing the metallic melt. The melt closest to the chill plate solidifies first due to the lower temperature and establishes a solidification front in the melt, the front moving in a direction away from the chill plate. The nature of nickel-based alloy solidification is such that the [001] axis direction of the crystals inherently lie along the direction of the solidification, unless seeding or other techniques are used. In situations where a set of separate columnar grains with aligned [001] axes is produced, the columnar grains 26 may produce desirable properties in the part in the direction along which the columnar grains lie. In the planes perpendicular to the length of the columnar grains the secondary crystallographic orientations may vary at random. Thus, the material will have two different sets of mechanical properties; a first set of longitudinal mechanical properties, and a second set of transverse mechanical properties. The material is said to be transversely isotropic.

The directional solidification process a single-crystal metallic parts with one controlled axes as described by Piearcey in U.S. Pat. No. 3,494,709 for example. In a solidification of FCC metallic alloys, such as superalloys used in gas turbine engines, a part such as the turbine blade 29 solidified accordingly can have a controlled primary crystallographic orientation [001] and a randomly-oriented secondary crystallographic orientation [100]. The primary crystallographic orientation may be the crystallographic orientation which lies along the axis along which the solidification interface moves and, for the turbine blade 29, may be chosen to be the airfoil stacking line 40 or other suitably chosen axis.

A resulting single-crystal turbine blade 29 may have desirable material properties in the primary crystallographic orientation, e.g. cracking and subsequent propagation between blade airfoil 30 leading and trailing edges may be reduced by controlling the primary crystallographic orientation during manufacturing to be aligned with an airfoil stacking line 40 or other direction traverse to an axis connecting the leading and trailing edges of the airfoil 30. The properties of a part will depend on how the axes of the single crystal are oriented with respect to the part axes. Cast superalloys are metals that may be suitable for high temperature (~650° C.) service. Single-crystal turbine blades may be made from various superalloys, including those derived from nickel superalloy materials and other alloys used in the past in equiaxed and columnar grain castings. Aspects of the present disclosure are relevant to nickel based alloys and also other FCC materials such as alloys of cobalt, iron and other metals and metal systems.

Directional solidification processes as taught by Piearcey or other processes to produce single-crystal parts may be suitable for making single-crystal articles in aspects of the present disclosure. A single-crystal part manufactured in such a manner may exhibit three-fold orthotropy, i.e. the orthotropy produced by fixing, during manufacturing, all the crystal axes to produce the single crystal. As mentioned previously, all three axes of a single-crystal structure can be fixed by fixing both a primary and secondary crystallographic orientation of the crystal. Turbine blades 29 may manufactured as single crystals. The secondary orientation of the crystal may also be controlled using suitable manufacturing processes.

In some embodiments using directional solidification, a single crystal with controlled primary and secondary crystallographic orientations may be obtained by using seeding. In seeding, a previously made single crystal may be placed at the bottom of the mold in contact with the melt at one end. When molten metal contacts the seed, it may partially melt the seed. When the melt is progressively cooled, the crystal growth is epitaxial from the seed. In some embodiments of "high rate" directional solidification, a seed is placed on a chill plate at the bottom of a ceramic mold. Seeding has been used in instances both where orientation is to be controlled, and where it is simply a convenient technique for forming a single crystal. When a single-crystal structure is initiated in molten metal, it is caused to propagate through the molten casting by progressively moving a thermal gradient through a part. Often, the crystal growth must take place transverse to the direction in which the primary thermal gradient is moved. This is the situation, for example, when the part has a body with an overhanging flange. The crystal must grow laterally while the gradient continues to move along the primary axis of the part. In other embodiments, a different approach may be used to manufacture single-crystal parts: single-crystal pieces may be formed separately and then diffusion bonded together, to form a unitary part. However, this is only accomplished when the respective parts have matching crystallographic orientations. In still other embodiments, two or more seeds are provided with a mold containing molten metal. Directional solidification is then carried out so that separate solidification interfaces move simultaneously through the molten metal, emanate from each seed, and the interfaces merge thereafter into a unitary solidification interface. The unitary interface is then caused to move through the molten metal in the mold, to form the article.

A single-crystal article made in conformance with the foregoing method will be one which substantially has properties associated with an ideal single-crystal article with a possible mismatch in orientation where the separate solidification interfaces merge. So long as the mismatch is less than a critical value at which mechanical properties may sharply decrease, the article and the method of making it may be considered to be a method for manufacturing a single-crystal article with a controlled primary and secondary orientations, i.e. all three axes are substantially controlled during manufacturing.

The aforementioned manufacturing methods and others that produce single-crystal articles having a substantially controlled crystallographic orientation are intended to be within the scope of manufacturing processes for single-crystal articles, with controlled primary and secondary crystallographic orientations, envisaged in the aspects of the present disclosure. For example, in some of such manufacturing methods the orientation of the different axes may be controlled to within 5° but not necessarily exactly.

Figure 6:
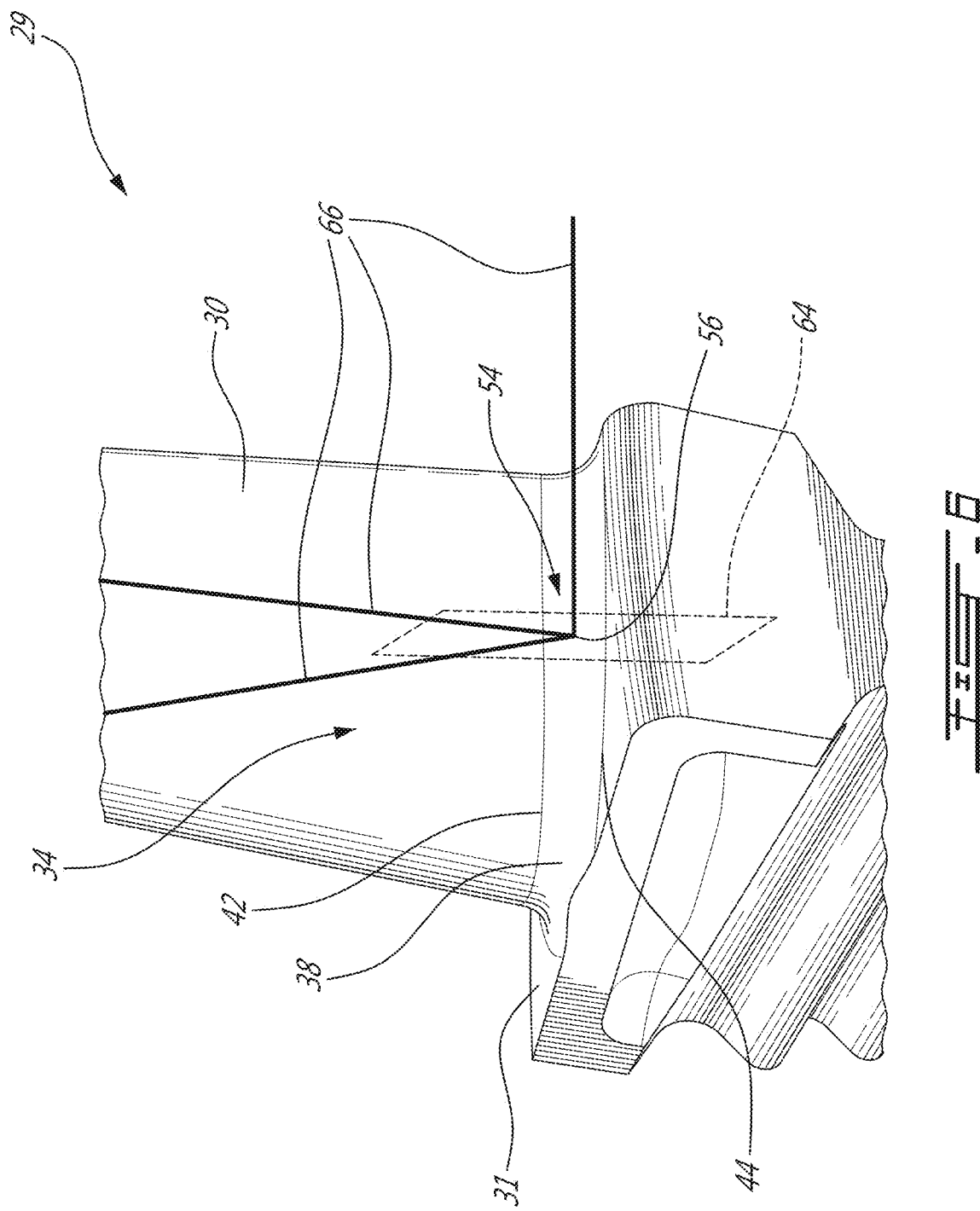
FIG. 6 shows an exemplary single-crystal turbine blade manufactured according to some aspects of the present disclosure.

FIG. 6 shows an exemplary single-crystal turbine blade 29 manufactured according to some aspects of the present disclosure. Crystal axes 66 and a reference plane 64 are shown. In order to reduce stresses in the root fillet 38 of the turbine blade 29, e.g. the previously mentioned stresses arising due to slowly-varying dynamic modes, aspects of the present disclosure may involve substantially controlling, during manufacturing using a single-crystal manufacturing method that allows substantial control of the complete crystal orientation, both the primary and secondary crystallographic orientations of the crystal structure in accordance with one or more parameters (e.g., geometry, edge, location of peak stress and/or other properties) of the root fillet 38. In some embodiments, the crystallographic orientations may be controlled, at least substantially, using one of the manufacturing processes mentioned above.

In some embodiments, the secondary crystallographic orientation [100] may be substantially controlled so that it is approximately parallel (e.g., tangent) to a portion of an edge 42, 44 of the root fillet 38. The edge may be the edge 42 proximal to the blade airfoil 30. In some embodiments, the portion of the edge 42 may be proximal to or on the suction side 34 of the blade airfoil 30. A secondary crystallographic orientation [100] may then be controlled to be orthogonal to the primary crystallographic orientation [001].

In some embodiments, a reference plane 64 may be defined as normal to the portion of the edge 42 of the root fillet 38 and passing through a nominal point 56 in a target portion 54 of the root fillet 38. The primary crystallographic orientation [001] may lie in the reference plane 64.

In various embodiments, the nominal point 56 may be a location of expected highest, or peak, stress in the root fillet 38 during use or may be a location where stress reduction is important for improving root fillet durability, or any other location important for turbine blade structural integrity during gas turbine operation. Such location(s) may be determined by experimental testing, performing calculations using known relationships relating to stresses in turbine blades, analyzing historical data from in-service turbine blades or turbine blades otherwise carried into operation, or performing simulations and calculations involving finite element analyses of a turbine blade under loading, or any other method for determining locations important for turbine blade structural integrity.

Figure 7:
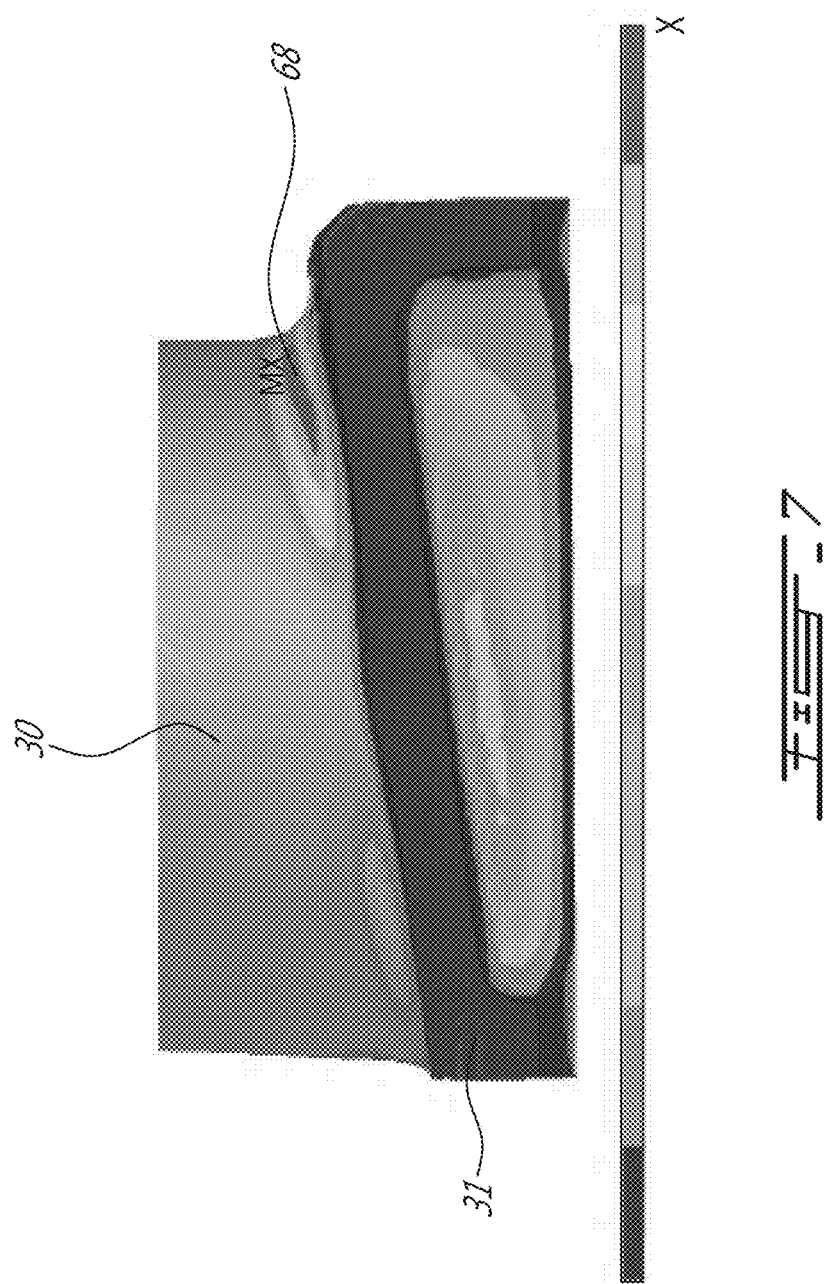
FIG. 7 shows a stress distribution in a root fillet of a single-crystal turbine blade made of a material where a primary crystal axis is controlled and a secondary crystal axis is uncontrolled.

FIG. 7 shows a stress distribution in a root fillet 38 of a single-crystal turbine blade made of a material wherein a primary crystallographic orientation is controlled and the secondary crystallographic orientation is left uncontrolled. The stress distribution may be calculated using finite element analysis. The calculated stress distributions shows a location of peak stress 68 in the root fillet. Such a location may be chosen as the nominal point 56 in some embodiments of aspects of the present disclosure for the purpose of controlling the secondary crystallographic orientation. The stress distribution also shows a root fillet stress being a peak stress in a lower portion of the turbine blade 29.

Figure 8:
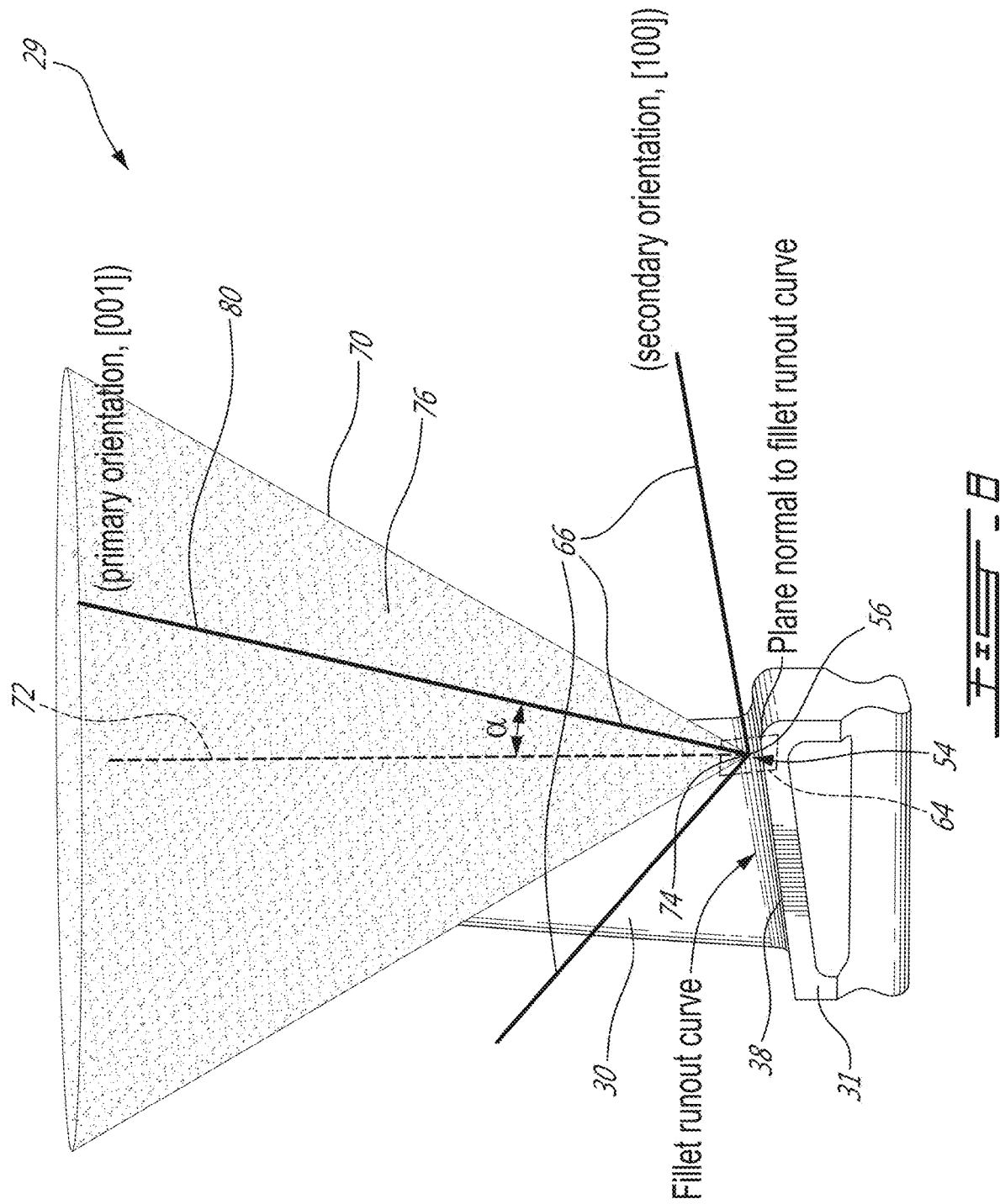
FIG. 8 shows a schematic of an embodiment of a single-crystal turbine blade manufactured according to some aspects of the present disclosure.

FIG. 8 shows a schematic of an embodiment of a single-crystal turbine blade 29 manufactured according to some aspects of the present disclosure, the schematic showing crystal axes 66, a reference plane 64, and a reference conical surface 70. In such and other embodiments, the secondary crystallographic orientation [100] may be substantially controlled so as to be oriented approximately parallel to a portion of an edge 42 (e.g., a fillet runout curve) (see FIG. 4) of the root fillet 38 and passing through the nominal point 56. For example, the nominal point 56 may be chosen using one of the methods described previously. The reference plane 64 may further be defined as passing through the nominal point 56 and being normal to the portion of the edge 42 of the root fillet 38 used to define the secondary crystallographic orientation [100]. A reference conical surface 70 may also be defined with respect to the nominal point 56 and the parameter of the root fillet 38 of the single-crystal turbine blade 29. In some embodiments, the reference conical surface 70 has an apex 74 located at the nominal point 56 and has a central axis of symmetry 72. In some embodiments, the central axis of symmetry 72 is parallel to an airfoil stacking line 40 (see FIG. 3). The reference conical surface 70 may have an inclined portion 76 emanating from the apex 74 and forming an angle $\alpha$ with the central axis of symmetry 72. In some embodiments, angle $\alpha$ may be about 30°. In some embodiments, angle $\alpha$ may be between 25° and 35°. In some embodiments, angle $\alpha$ may be between 20° and 40°. In some embodiments, angle $\alpha$ may be between 10° and 80°, between 25° and 45°, between 20° and 60°, between 20° and 70°, between 20° and 60° or between 30° and 45°. In some embodiments, the crystallographic orientation may be substantially controlled during manufacturing so that the secondary crystallographic orientation [100] is approximately perpendicular to the reference plane 64 and the primary crystallographic orientation [001] lies in the reference plane 64, orthogonal to the secondary crystallographic orientation [100]. In certain embodiments, the primary crystallographic orientation [001] may be substantially controlled to lie approximately on an intersection between the reference plane 64 and the reference conical surface 70.

In these embodiments, the manufacturing process may involves substantially controlling the primary crystallographic orientation [001] so that it is approximately parallel to a locus of points or line formed at the intersection 80 of the reference plane 64 and reference conical surface 70. In some of these embodiments, the nominal point 56 may be proximal to or on the suction side 34 of the blade airfoil 30.

Figure 9:
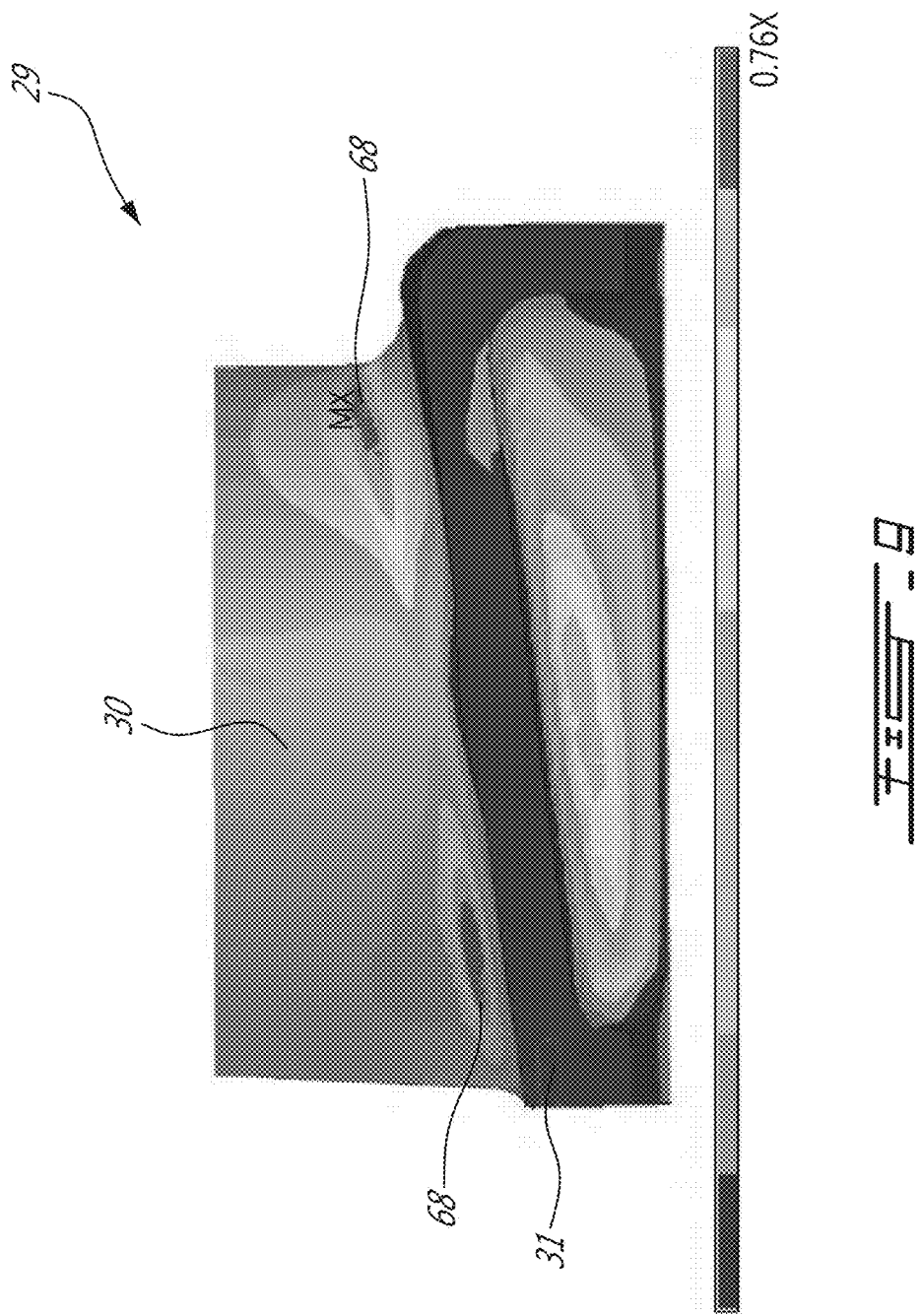
FIG. 9 shows stress distribution in a root fillet of a single-crystal turbine blade manufactured according to some aspects of the present disclosure.

FIG. 9 shows stress distribution in a root fillet 38 of a single-crystal turbine blade 29 manufactured according to some aspects of the present disclosure. The stress distribution may be calculated using finite element analysis. The stress distribution shows a decrease in the stresses at the peak stress locations 68 in the root fillet 38 compared to a blade of similar geometry shown in FIG. 7 wherein the secondary crystallographic orientation [100] was not controlled during manufacturing in accordance with this disclosure.

During operation of the gas turbine engine 10, the turbine disc 35 rotates at a high rotational speed when hot gases from the combustor 16 impinge on the turbine blades 29, thereby imparting significant mechanical and thermal loads to the turbine blade 29 and particularly the root fillet 38. In some embodiments, a single-crystal turbine blade 29 incorporating a crystal structure manufactured according to aspects of the present disclosure may experience comparatively lower stresses in the root fillet 38 and thereby reduce the probability of part failure. A lower design stress in the root fillet 38 achieved by controlling crystallographic orientation during manufacturing as described herein may help mitigate the need for strengthening of the single-crystal turbine blade 29 by means such as changing the root fillet shape or increasing airfoil thickness, which may compromise the aerodynamic performance of the airfoil 30 and/or result in additional weight.

Aspects of the present disclosure will also be applicable to turbine blades that may not be mountable to a turbine disc 35. For example, turbines blades being integral to a turbine disc 35 may also have a fillet at the intersection of the blade airfoil 30 and a turbine disc circumference. Aspects of this disclosure may also be applicable to other parts of the gas turbine engine constructed from a single-crystal material, such as possibly gas turbine vanes and any other machine parts wherein a fillet is subjected to mechanical stresses.

The gas turbine blades and other parts discussed in the description above need not be entirely made of a single-crystal structure material. For example, only the root fillet 38 and/or airfoil 30 may be made of a single crystal in some embodiments. For example, an airfoil portion of single crystal may be provided with polycrystalline ends. In some embodiments, the platform 31, root fillet 38 and airfoil 30 may all be made from the same single crystal.

The above description is meant to be exemplary only, and one skilled in the relevant arts will recognize that changes may be made to the embodiments described without departing from the scope of the invention disclosed. The present disclosure may be embodied in other specific forms without departing from the subject matter of the claims. The present disclosure is intended to cover and embrace all suitable changes in technology. Modifications which fall within the scope of the present invention will be apparent to those skilled in the art, in light of a review of this disclosure, and such modifications are intended to fall within the appended claims. Also, the scope of the claims should not be limited by the preferred embodiments set forth in the examples, but should be given the broadest interpretation consistent with the description as a whole.

What is claimed is:

1. A method of making a single-crystal turbine blade with a material having a face centered cubic crystallographic structure, the method comprising:
   during manufacturing of the single-crystal turbine blade, controlling a secondary crystallographic orientation of the material to be substantially perpendicular to a reference plane that is substantially perpendicular to an edge of a root fillet between an airfoil of the single-crystal turbine blade and a platform of the single-crystal turbine blade.

2. The method of claim 1, comprising controlling a primary crystallographic orientation of the material to be at about 30 degrees from an airfoil stacking line of the single-crystal blade.

3. The method of claim 1, wherein the reference plane passes through a peak stress location in the root fillet.

4. The method of claim 3, wherein the peak stress location in the root fillet is on a suction side of the single-crystal turbine blade.

5. The method of claim 3, comprising controlling a primary crystallographic orientation of the material to be substantially parallel to a line of intersection between the reference plane and a reference conical surface, wherein:
   the reference conical surface includes a central axis of symmetry substantially parallel to an airfoil stacking line of the single-crystal blade; and
   an apex of the reference conical surface is located at the peak stress location in the root fillet.

6. The method of claim 5, wherein the reference conical surface forms an angle between 20 and 40 degrees with the central axis of symmetry.

7. The method of claim 5, wherein the reference conical surface forms an angle of about 30 degrees with the central axis of symmetry.

8. The method of claim 1, wherein the edge of the root fillet is closer to the airfoil than to the platform.

9. A turbine blade comprising:
   an airfoil made of a material having a single-crystal face centered cubic crystallographic structure;
   a platform connected to the airfoil; and
   a root fillet defined between the airfoil and the platform;
   wherein a secondary crystallographic orientation of the material is substantially perpendicular to a reference plane that is substantially perpendicular to an edge of the root fillet.

10. The turbine blade of claim 9, wherein a primary crystallographic orientation of the material is at about 30 degrees from a stacking line of the airfoil.

11. The turbine blade of claim 9, wherein the reference plane passes through a peak stress location in the root fillet.

12. The turbine blade of claim 9, wherein the edge of the root fillet is closer to the airfoil than to the platform.

13. The turbine blade of claim 11, wherein the peak stress location in the root fillet is on a suction side of the single-crystal turbine blade.

14. The turbine blade of claim 11, wherein:
   a primary crystallographic orientation of the material is substantially parallel to a line of intersection between the reference plane and a reference conical surface;
   the reference conical surface includes a central axis of symmetry substantially parallel to a stacking line of the airfoil; and
   an apex of the reference conical surface is located at the peak stress location in the root fillet.

15. The turbine blade of claim 14, wherein the reference conical surface forms an angle between 20 and 40 degrees with the central axis of symmetry.

16. The turbine blade of claim 14, wherein the reference conical surface forms an angle of about 30 degrees with the central axis of symmetry.

17. A method of making a turbine blade including an airfoil made of a material having a single-crystal crystallographic structure, a platform connected to the airfoil and a root fillet defined between the airfoil and the platform, the method comprising:
   determining a location of peak stress in the root fillet expected during use of the turbine blade; and
   during manufacturing of the turbine blade, controlling a secondary crystallographic orientation of the material to be substantially perpendicular to a reference plane that is substantially perpendicular to an edge of the root fillet and that passes through the location of peak stress in the root fillet.

18. The method of claim 17, comprising controlling a primary crystallographic orientation of the material to be at about 30 degrees from a stacking line of the airfoil.

* * * * *